US009907215B2

United States Patent
Backhaus et al.

(10) Patent No.: US 9,907,215 B2
(45) Date of Patent: Feb. 27, 2018

(54) POWER ELECTRONIC SUBASSEMBLY WITH CAPACITOR

(71) Applicant: Semikron Elektronik GmbH & Co., KG, Nürnberg (DE)

(72) Inventors: Klaus Backhaus, Fürth (DE); Roland Bittner, Stegaurach (DE); Marco Lederer, Nürnberg (DE); Rainer Popp, Petersaurach (DE)

(73) Assignee: Semikron GmbH & Co., KG, Nürnberg (DE)

( * ) Notice: Subject to any disclaimer, the term of this patent is extended or adjusted under 35 U.S.C. 154(b) by 0 days.

(21) Appl. No.: 15/243,168

(22) Filed: Aug. 22, 2016

(65) Prior Publication Data

US 2017/0055366 A1 Feb. 23, 2017

(30) Foreign Application Priority Data

Aug. 21, 2015 (DE) .................... 10 2015 113 873

(51) Int. Cl.
*H05K 7/20* (2006.01)
*H01L 23/473* (2006.01)
(Continued)

(52) U.S. Cl.
CPC ............ *H05K 7/2089* (2013.01); *H01G 2/02* (2013.01); *H01G 2/08* (2013.01); *H01G 2/106* (2013.01);
(Continued)

(58) Field of Classification Search
CPC . G06F 1/181–1/182; H05K 7/20218–7/20381;
(Continued)

(56) References Cited

U.S. PATENT DOCUMENTS 8,902,612 B2 12/2014 Inuduka
2002/0186545 A1* 12/2002 Fukada ................ H05K 7/1404
361/719
(Continued)

FOREIGN PATENT DOCUMENTS

DE 10 2012 201 766 8/2013

OTHER PUBLICATIONS

German Examination Report in parallel case; dated Apr. 22, 2016.

*Primary Examiner* — Anthony Haughton
*Assistant Examiner* — Razmeen Gafur
(74) *Attorney, Agent, or Firm* — The Law Offices of Roger S. Thompson

(57) ABSTRACT

A power electronic subassembly having a housing and a capacitor arranged therein. The housing has an internally arranged cooling area, which is cooled by a cooling device integrated in the housing or an external cooling device. The capacitor has a contact device of a first polarity and a contact device of a second polarity and a capacitor busbar system. This capacitor busbar system comprises first and second sheet-like shaped metal bodies. The first metal body with the first contact device of the first polarity and the second metal body with the second contact device of the second polarity are electrically conductively connected. A first portion of the first metal body has a first subportion, which is arranged parallel to and at a distance from the cooling area, and a second subportion, which is in thermal contact with the cooling area, wherein the two subportions are connected by an intermediate portion.

16 Claims, 4 Drawing Sheets

(51) Int. Cl.
*H01G 4/38* (2006.01)
*H01G 4/40* (2006.01)
*H01G 2/08* (2006.01)
*H05K 7/14* (2006.01)
*H01G 2/02* (2006.01)
*H01G 2/10* (2006.01)
*H01L 23/02* (2006.01)
*H01L 23/367* (2006.01)
*H01L 23/467* (2006.01)
*H02M 7/00* (2006.01)

(52) U.S. Cl.
CPC ............... *H01G 4/38* (2013.01); *H01G 4/40* (2013.01); *H01L 23/02* (2013.01); *H01L 23/3675* (2013.01); *H01L 23/467* (2013.01); *H01L 23/473* (2013.01); *H05K 7/1432* (2013.01); *H05K 7/20* (2013.01); *H05K 7/209* (2013.01); *H02M 7/003* (2013.01)

(58) Field of Classification Search
CPC .............. H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 2003/0090873 A1* | 5/2003 | Ohkouchi | H01L 23/4006 361/704 |
| 2004/0062006 A1* | 4/2004 | Pfeifer | F28F 3/12 361/699 |
| 2007/0075419 A1* | 4/2007 | Fukuda | H01L 23/49531 257/717 |
| 2009/0309215 A1* | 12/2009 | Kitabatake | H01L 23/3672 257/720 |
| 2010/0078807 A1* | 4/2010 | Schulz | H01L 23/34 257/713 |
| 2011/0228508 A1* | 9/2011 | Inuduka | H02M 7/003 361/811 |
| 2011/0235279 A1* | 9/2011 | Mori | H01L 23/3735 361/717 |
| 2013/0082377 A1* | 4/2013 | Bennion | H01L 23/36 257/712 |
| 2013/0094122 A1* | 4/2013 | Domes | H05K 7/1432 361/321.1 |
| 2013/0294032 A1* | 11/2013 | Stella | H01L 23/367 361/718 |
| 2014/0247554 A1* | 9/2014 | Sharma | H05K 7/1432 361/695 |
| 2014/0268969 A1* | 9/2014 | Crouch | H02M 7/003 363/141 |
| 2014/0313673 A1* | 10/2014 | Akamatsu | H05K 7/2039 361/706 |
| 2014/0339693 A1* | 11/2014 | Hotta | H01L 23/473 257/714 |
| 2014/0355212 A1* | 12/2014 | Campbell | H05K 7/20236 361/699 |
| 2015/0003019 A1* | 1/2015 | Ide | H05K 1/0271 361/705 |
| 2015/0131232 A1* | 5/2015 | Ishino | H01L 23/4334 361/707 |
| 2015/0289410 A1* | 10/2015 | Salat | H01L 23/473 361/699 |
| 2015/0303164 A1* | 10/2015 | Chen | H01L 24/32 361/720 |
| 2015/0334875 A1* | 11/2015 | Topolewski | H05K 7/20254 361/699 |
| 2016/0088778 A1* | 3/2016 | Geisler | H02M 7/003 361/699 |
| 2016/0157381 A1* | 6/2016 | Takeuchi | H05K 7/20927 361/709 |
| 2016/0242312 A1* | 8/2016 | Singh | H05K 1/111 |
| 2017/0062307 A1* | 3/2017 | Pola | H01L 23/473 |

* cited by examiner

POWER ELECTRONIC SUBASSEMBLY WITH CAPACITOR

BACKGROUND OF THE INVENTION

1. Field of the Invention

The invention is directed to a power electronic subassembly with a housing, with a capacitor device arranged therein and preferably with a power semiconductor module.

2. Description of the Related Art

Some known prior art power electronic systems include a multipart housing, comprising at least one cover and a frame-like housing part. Such a system is, for example, disclosed in German Published Patent Application DE 10 2012 201 766 A1. This system also has connection devices, a power electronic circuit arrangement, which may be formed as a power semiconductor module arranged in the housing and having a housing of its own, and a capacitor device covered by a first cover. The capacitor device for its part has a plurality of capacitors and an intermediate space between them. Here, a feeder of the first cover reaches into an intermediate space of the capacitor device.

SUMMARY OF THE INVENTION

It is an object of the invention is to provide an improved power electronic subassembly, wherein the capacitor device is arranged in a further improved manner.

The power electronic subassembly according to the invention is formed with a housing and a capacitor device arranged therein. The housing has an internally arranged cooling area, which is formed such that it can be cooled by a cooling device integrated in the housing or an external cooling device. The capacitor device has a capacitor with a contact device of a first polarity, a contact device of a second polarity and a capacitor busbar system. This capacitor busbar system comprises a first sheet-like shaped metal body and a second sheet-like shaped metal body, wherein the first sheet-like shaped metal body with the first contact device of the first polarity and the second sheet-like shaped metal body with the second contact device of the second polarity are connected in an electrically conducting manner. Furthermore, a first portion of the first shaped metal body has a first subportion, which is arranged parallel to, and at a distance from, the cooling area, and a second subportion, which is in thermal contact with the cooling area, wherein the two subportions are connected to one another by an intermediate portion. As is customary in the art, here the two polarities are DC voltage potentials of different signs.

It goes without saying that the respective portions of the contact device particularly comprise at least one respective portion, and the capacitor at least one capacitor.

It is preferred if the first shaped metal body and the second shaped metal body are arranged closely adjacent to one another. This is to be understood in particular as meaning that these two shaped metal bodies are arranged closely adjacent to one another over at least 80%, in particular at least 90%, of their two-dimensional extent. Moreover, closely adjacent in these regions is intended to mean that, within the limits of the technical and geometrical conditions, the distance in the normal direction is as far as possible minimal, or only insignificantly greater. For reliable potential separation, an insulation film is advantageously arranged between the first shaped metal body and the second shaped metal body.

It is also advantageous if the first portion has a meandering cross section, wherein the second subportion forms with adjacent intermediate portions a U-shaped web. In the case of a number of second subportions, consequently a number of U-shaped webs are formed. As an alternative to this, the respective second subportion may form a cup-shaped boss with an adjacent intermediate portion.

It may similarly be preferred if the second subportion is in direct or indirect thermal contact with the cooling area. In the case of indirect thermal contact between the second subportion and the cooling area, it is preferred if an electrically insulating insulation device, in particular a plastic film, or an insulating ceramic layer, is arranged therebetween.

Advantageously, the capacitor is arranged on the side of the capacitor busbar system that is facing away from the cooling area.

It is preferred if a first portion of the second shaped metal body, which is arranged substantially parallel to the first portion of the first shaped metal body, has clearances for leading through the first contact devices.

Furthermore, the shaped metal body respectively assigned to a contact device may respectively have cutaway contact tabs in the region of first subportions for, preferably material-bonded, electrical connection to the contact devices.

It is also preferred if a power semiconductor module is arranged in the housing and is connected polarity-appropriately to module connections of the capacitor busbar system. As is customary in the art, the housing of the subassembly additionally has external connection elements.

It is particularly advantageous if the housing has a cup-like depression, the bottom of which at least partially forms the cooling area and wherein the capacitor is arranged in this depression. Here, the depression may also be filled with an electrically insulating potting compound. This potting compound may completely cover the capacitors for heat dissipation or for vibration damping. In principle, the potting compound may also consist of two or more different potting compounds, in particular of different hardness or viscosity. These potting compounds are then advantageously arranged in layers.

It goes without saying that the various configurations of the invention can be realized individually or in any desired combinations to achieve improvements. In particular, the features mentioned and explained above can be used not only in the specified combinations, but also in other combinations or on their own without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
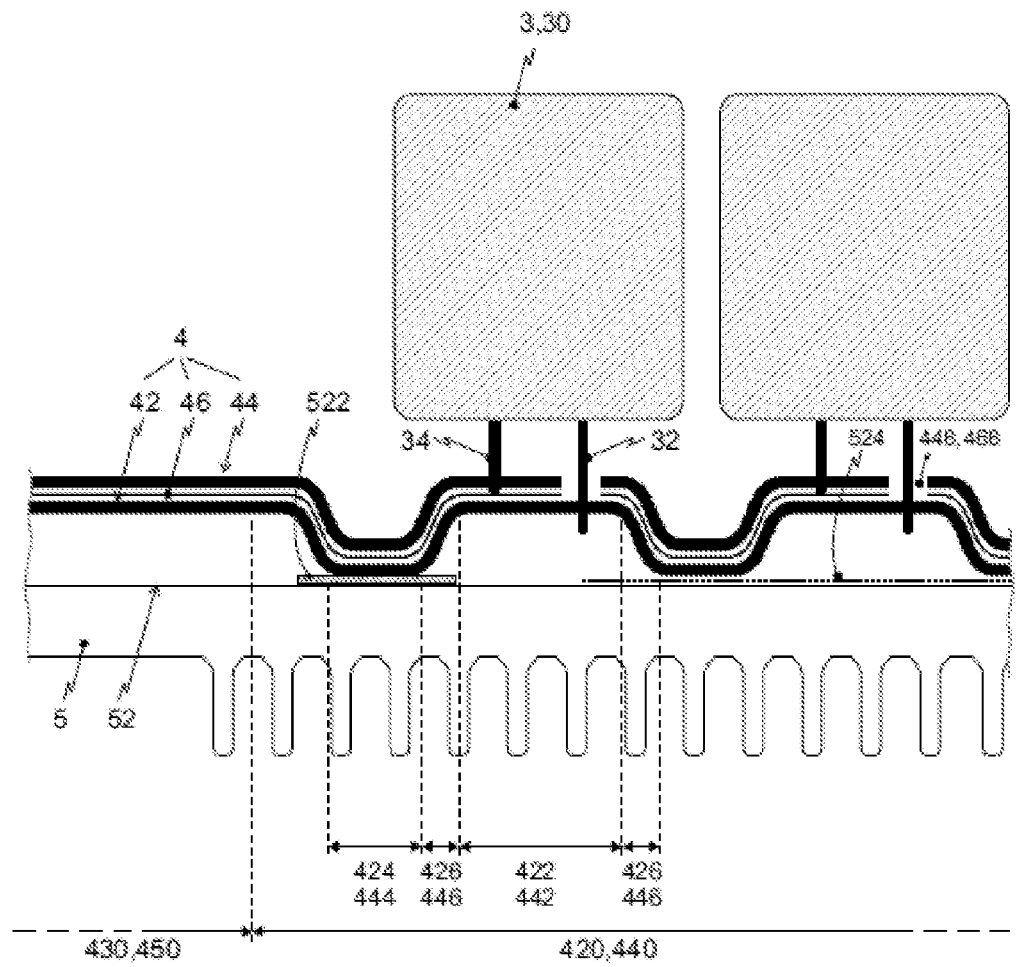
FIG. 1 shows a first configuration of part of a power electronic subassembly according to the invention.

FIG. 1 shows a first configuration of part of a power electronic subassembly according to the invention. The only part that is shown here of a housing is its integrated cooling device 5. Cooling device 5, formed as an air cooling device here, has a cooling area 52, on which only partially here, without restricting generality, an electrically insulating insulation device is arranged in direct thermal contact therewith. Two alternatives of the configuration of this insulation device that are customary in the art are shown. On the one hand, as shown on the left, it may be formed as a sheet-like ceramic body 522 or as a ceramic layer. On the other hand, it may be preferred, as shown on the right, if the insulation device is formed as a plastic film 524. In principle, the insulation device may be adhesively bonded to contact area 52.

Also shown is a capacitor device 3, which here comprises two capacitors 30 and a capacitor busbar system 4. Capacitor busbar system 4 is formed as two sheet-like stamped-and-bent bodies, that is to say generally as two sheet-like shaped metal bodies 42, 44. First sheet-like shaped metal body 42, the lower one here, has a first polarity, that is to say a first electrical potential, which is positive here by way of example. Second sheet-like shaped metal body 44, the upper one here, has a second polarity, that is to say a second electrical potential, which is negative here by way of example. For potential separation, an insulation film 46 is arranged between the shaped metal bodies 42, 44, which are otherwise arranged closely adjacent to one another.

Capacitor busbar system 4, and consequently the respective shaped metal bodies 42, 44 forming capacitor busbar system 4, has two portions; first portion 420, 440 is the one on which capacitors 30 are arranged, while second portion 430, 450 is the one that forms the DC connection, including the supply conductor for this, of capacitor device 3.

The respective first portion 420, 440 has in turn two configurations of subportions, on the one hand first subportions 422, 442, which are parallel to and at a distance from cooling area 52 of the housing, and on the other hand second subportions 424, 444, which are parallel to and in thermal contact with, and consequently adjacent to, cooling area 52 of the housing. First and second subportions 422, 442 and 424, 444, respectively, are connected by intermediate portions 426, 446. The sequence of first subportions, intermediate portions, second subportions, intermediate portions, etc. consequently forms a cross-sectionally meandering structure of the respective shaped metal body or of its first portion.

It is important here that the respective second subportion 424, 444 forms with the laterally adjacent intermediate portions 426, 446 U-shaped webs, which have an area parallel to cooling area 52. This area, that is to say the respective second subportion 424, 444, is in indirect thermal contact here with cooling area 52. This indirect thermal contact is formed by the respectively second subportion 424, 444 coming to lie on an insulation device 522, 524 described above.

It would also be possible in principle, though not shown here, to form a direct thermal contact between the cooling area and the adjacent shaped metal body, here first shaped metal body. It is then advantageous in this respect however if this first shaped metal body is at ground potential.

Arranged on the side of first portion 420, 440 of capacitor busbar system 4 that is facing away from cooling area 52 are the two capacitors 30. The respective first contact devices 32 of capacitors 30 are connected in an electrically conducting manner to first subportion 422 of first portion 420 of first shaped metal body 42. For this purpose, second shaped metal body 44, and of course also insulation film 46, have clearances 448, 468 for leading through first contact devices 32. The respective second contact devices 34 of capacitors 30 are connected in an electrically conducting manner to first subportion 442 of first portion 440 of second shaped metal body 44.

Figure 2:
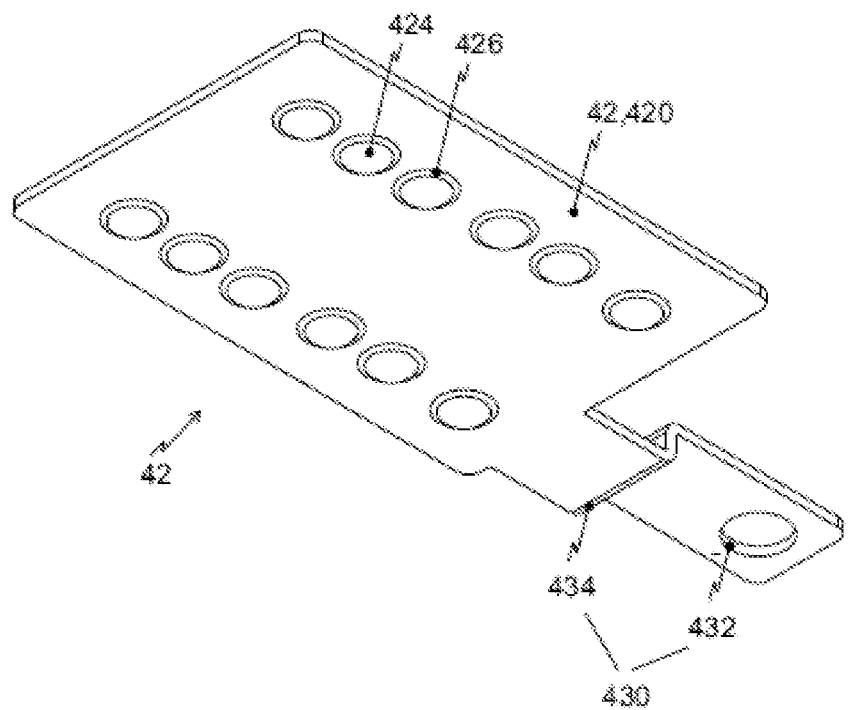
FIG. 2 shows a configuration of part of a capacitor busbar system.

FIG. 2 shows a configuration of part of a capacitor busbar system. A first sheet-like shaped metal body 42 is shown. This has first and second portions 420, 430. In first portion 420, second subportions 424 are formed together with intermediate portions 426 as cup-shaped bosses. These bosses are arranged in two rows and are surrounded by a first subportion 422.

Second portion 430 has a connecting device 432, formed here as a screwing eyelet, of first shaped metal body 42 of capacitor busbar system 4. This serves for the internal connection, cf. FIG. 5, to a power semiconductor module, which like the capacitor device is arranged in the housing of a power electronic subassembly. Second portion 430 of the shaped metal body also has a supply conductor 434 between the screwing eyelet and first portion 420.

Figure 3:
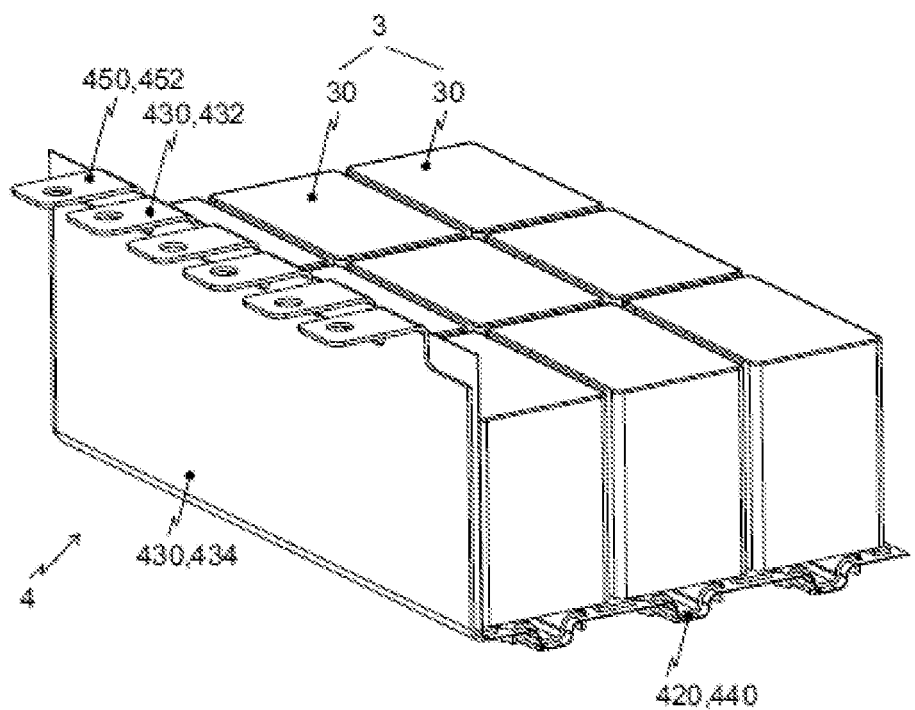
FIGS. 3 and 4 show a capacitor device with a capacitor busbar system from two viewing angles.
Figure 4:
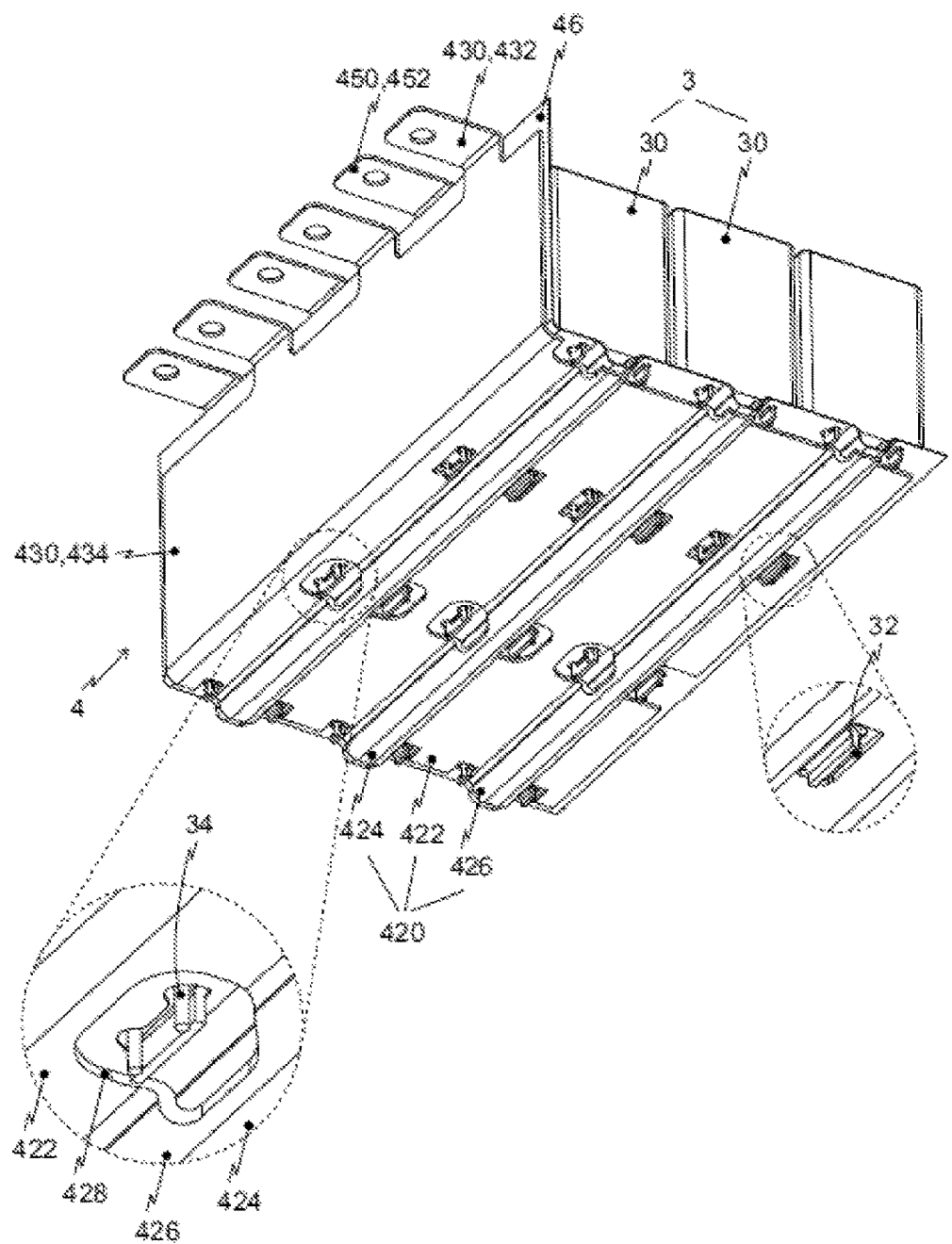

FIGS. 3 and 4 show a capacitor device 3 with a capacitor busbar system 4 and nine capacitors 30 arranged in a matrix, from two viewing angles. Capacitor busbar system 4 is formed by two shaped metal bodies 42, 44, which are arranged closely adjacent to one another and have an insulation film 46 arranged in between. Each of the two shaped metal bodies 42, 44 has a first portion 420, 440, for the arrangement of capacitors 30, and a second portion 430, 450, for the further electrical connection 432, 452, and an associated supply conductor portion 434 in between.

In a way comparable to FIG. 1, the respective first portion 420, 440 of the two shaped metal bodies 42, 44 has in turn a meandering cross section, which consequently forms here three U-shaped webs. It is preferred, but not necessary, that both shaped metal bodies 42, 44 have this shape, but first shaped metal body 42 would be sufficient. However, the variant shown is technically preferred for reasons of parasitic inductances.

The respectively U-shaped web is formed by a second subportion 424, which is intended for being placed flat, and consequently in good thermal contact, on the cooling area of the housing, cf. in this respect FIG. 1. The respectively second subportion 424 is connected to at least one first adjacent subportion 422 by means of an intermediate portion 426.

Each capacitor 30 has two contact devices 32, 34 of different polarity. For connecting contact device 32 of first polarity to first subportion 422 of the assigned first shaped metal body 42 of the capacitor busbar system 4, second shaped metal body 44, cf. FIG. 1, has a clearance, through which first contact device 32 reaches. This contact device is connected in an electrically conducting manner to a punched-out, protruding tab of first subportion 422 of first shaped metal body 42 by means of a material-bonded connection, here a welded connection. If, by contrast with the representation according to FIG. 1, both contact devices 32, 34 of capacitors 30 have the same length, second contact device 34 by analogy with the first, is however connected to first subportion 442 of second shaped metal body 44 and protrudes through a clearance 428 in first subportion 422 of first shaped metal body 42 in the direction of the cooling area.

It is important here that contact devices 32, 34 of capacitors 30 are respectively connected with the correct polarity and in an electrically conducting manner to the assigned shaped metal bodies 42, 44. It is also achieved by the configuration of shaped metal bodies 42, 44 that two contact devices 32, 34 of capacitors 30 are kept at a distance from the cooling area sufficiently to meet the internal insulating requirements of the power electronic subassembly and at the same time for good thermal coupling of capacitors 30 to the cooling area to be achieved.

Figure 5:
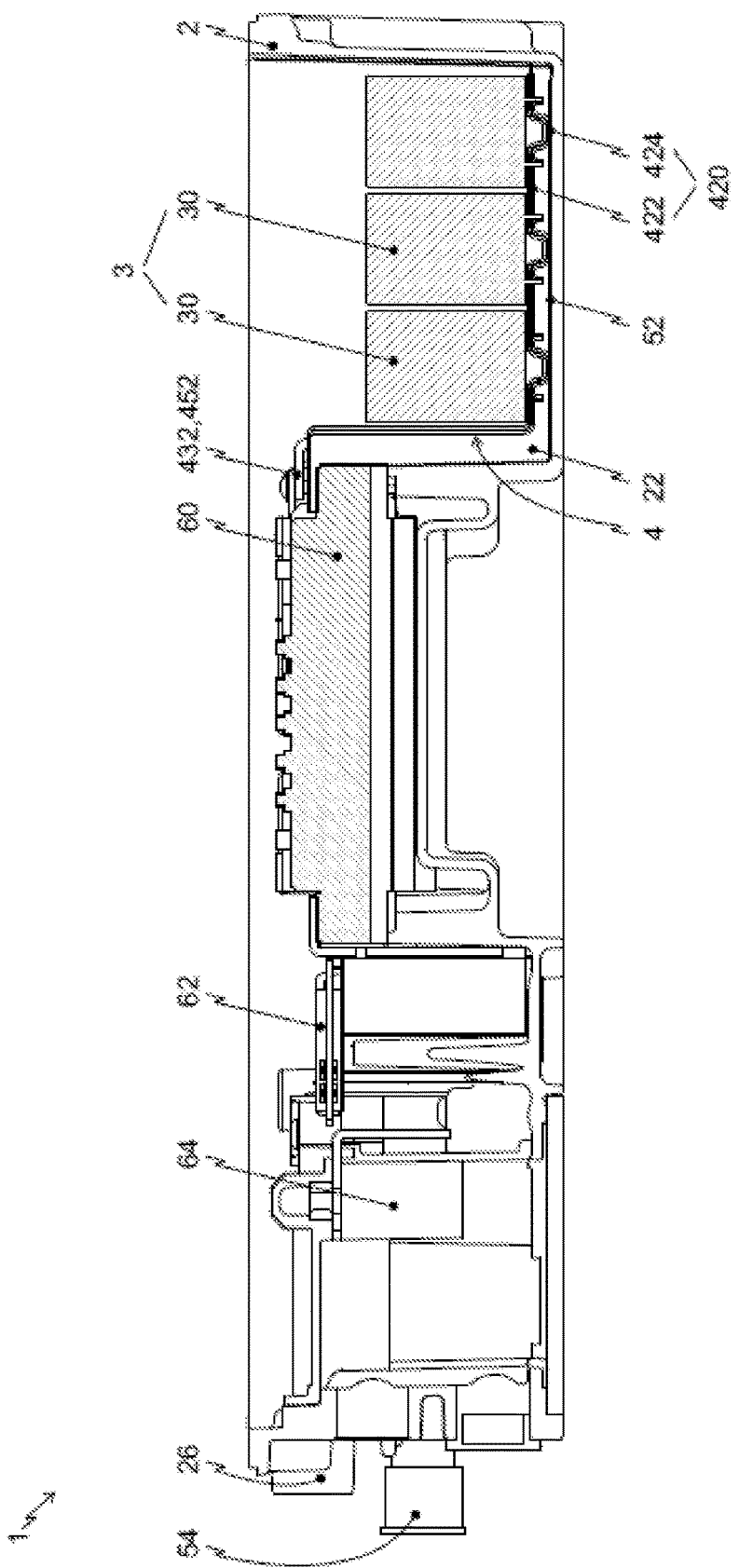
FIG. 5 shows a section through a power electronic subassembly according to the invention.

FIG. 5 shows a section through a power electronic subassembly 1 according to the invention with a capacitor device 3, a power semiconductor module 60 and a housing 2 with an integrated liquid cooling device. Housing 2 has external electrical-power 26 and cooling-liquid connections 54. A control board 62 arranged in housing 2 and an electrical-power sensor 64 are assigned to the power semiconductor module 60.

Housing 2 also has a cup-like depression 22, the bottom of which forms cooling area 52. Capacitors 30 of capacitor device 3 are completely arranged in this depression. Advantageously, but not shown, capacitors 30 are completely embedded in an insulating potting compound, which fills cup-like depression 22 almost completely.

Otherwise, capacitor device 3 is formed in the way described with respect to FIGS. 3 and 4. Second subportion 424 of first shaped metal body 42 is in indirect thermal contact with cooling area 52. For this purpose, an electrically insulating insulation device, here a plastic film, is arranged between second subportion 424 and cooling area 52.

A power semiconductor module 60 is connected polarity-appropriately to first portion, here having module connections 432, 452, of the capacitor busbar system 4. The capacitor device 3 consequently forms the intermediate-circuit capacitor of a three-phase power circuit.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power electronic subassembly comprising:
   a housing having an internally arranged cooling area, said cooling area being configured so that it can be cooled by a cooling device integrated into said housing; and
   a capacitor device arranged in said housing, said capacitor device having a capacitor with a first contact device of a first polarity, a second contact device of a second polarity and a capacitor busbar system, said capacitor busbar system including a first sheet-like shaped metal body and a second sheet-like shaped metal body;
   wherein said first and second sheet-like shaped metal bodies are connected in an electrically conducting manner and are arranged closely adjacent to one another over at least about 80% of their two-dimensional extent, and
   wherein a first portion of said first shaped metal body has
      a first subportion which is arranged parallel to and at a distance from said cooling area, and
      a second subportion, which is in thermal contact with said cooling area, and which is connected to said first subportion by an intermediate portion.

2. The subassembly of claim 1, further comprising an insulation film is disposed in between said first and second shaped metal bodies.

3. The subassembly of claim 1,
   wherein said first portion has a meandering cross section; and
   wherein said second subportion forms a U-shaped web with said adjacent intermediate portion.

4. The subassembly of claim 1, wherein said second subportion forms a cup-shaped boss with an adjacent intermediate portion.

5. The subassembly of claim 1, wherein said second subportion is in indirect thermal contact with said cooling area.

6. The subassembly of claim 5, wherein an electrically insulating insulation device is arranged between said second subportion and said cooling area.

7. The subassembly of claim 6, wherein said electrically insulating insulation device is a plastic film.

8. The subassembly of claim 6, wherein said electrically insulating insulation device is an insulating ceramic layer.

9. The subassembly of claim 1, wherein said capacitor is arranged on a side of said capacitor busbar system that is facing away from said cooling area.

10. The subassembly of claim 1, wherein said second shaped metal body includes a first portion which is arranged substantially parallel to said first portion of said first shaped metal body, and has clearances for leading through said first contact devices.

11. The subassembly of claim 1, wherein said first shaped metal body has at least one cutaway contact tab near said first subportion for electrical connection to one of said first and second contact devices.

12. The subassembly of claim 11, wherein said electrical connection of said contact devices and said contact tabs is via material-bonding.

13. The subassembly of claim 1, further comprising a power semiconductor module arranged in said housing, said power semiconductor module being connected polarity-appropriately to module connections of said capacitor busbar system.

14. The subassembly of claim 1,
wherein said housing has a cup-like depression having a bottom which forms said cooling area; and
wherein said capacitor is arranged in said depression.

15. The subassembly of claim 14, wherein said depression is filled with an electrically insulating potting compound.

16. The subassembly of claim 1, wherein said first and second sheet-like shaped metal bodies are arranged closely adjacent to one another over at least about 90% of their two-dimensional extent.

* * * * *